United States Patent
Wang et al.

(10) Patent No.: US 9,455,298 B2
(45) Date of Patent: Sep. 27, 2016

(54) WAFER-LEVEL PACKAGING METHOD OF BSI IMAGE SENSORS HAVING DIFFERENT CUTTING PROCESSES

(71) Applicant: China Wafer Level CSP Co., Ltd., Suzhou (CN)

(72) Inventors: Zhi-Qi Wang, Suzhou (CN); Qiong Yu, Suzhou (CN); Wei Wang, Suzhou (CN)

(73) Assignee: China Wafer Level CSP Co., Ltd., Suzhou (CN)

( * ) Notice: Subject to any disclaimer, the term of this patent is extended or adjusted under 35 U.S.C. 154(b) by 0 days.

(21) Appl. No.: 15/012,653

(22) Filed: Feb. 1, 2016

(65) Prior Publication Data

US 2016/0148972 A1   May 26, 2016

Related U.S. Application Data

(63) Continuation of application No. 14/150,307, filed on Jan. 8, 2014, now Pat. No. 9,305,961.

(30) Foreign Application Priority Data

Jan. 9, 2013 (CN) .......................... 2013 1 0007440

(51) Int. Cl.
*H01L 21/00* (2006.01)
*H01L 27/146* (2006.01)
*H01L 21/78* (2006.01)

(52) U.S. Cl.
CPC ..... *H01L 27/14687* (2013.01); *H01L 27/1464* (2013.01); *H01L 27/14618* (2013.01); *H01L 27/14636* (2013.01); *H01L 27/14683* (2013.01); *H01L 27/14698* (2013.01); *H01L 21/78* (2013.01); *H01L 2221/68327* (2013.01); *H01L 2924/0002* (2013.01)

(58) Field of Classification Search
None
See application file for complete search history.

(56) References Cited

U.S. PATENT DOCUMENTS

| | | | |
|---|---|---|---|
| 2007/0105345 A1* | 5/2007 | Kurosawa | H01L 21/78 438/460 |
| 2007/0176262 A1 | 8/2007 | Sirkin | |
| 2008/0070380 A1* | 3/2008 | Kusunoki | H01L 33/0095 438/462 |
| 2009/0045486 A1* | 2/2009 | Kohda | H01L 33/0095 257/615 |
| 2010/0173474 A1* | 7/2010 | Arita | H01L 21/78 438/462 |
| 2012/0161308 A1 | 6/2012 | Chu et al. | |
| 2014/0141596 A1* | 5/2014 | Matsuzaki | H01L 21/78 438/462 |

* cited by examiner

*Primary Examiner* — Thanh T Nguyen
(74) *Attorney, Agent, or Firm* — Seed IP Law Group PLLC (57) ABSTRACT

A wafer-level packaging method of BSI image sensors includes the following steps: S1: providing a wafer package body comprising a silicon base, an interconnect layer, a hollow wall and a substrate; S2: cutting the wafer package body via laser in a first cutting process to separate the interconnect layer of adjacent BSI image sensors; and S3: cutting the wafer package body via a blade in a second cutting process to obtain independent BSI image sensors. As a result, damage of the interconnect layer and the substrate may be decreased to improve performance and reliability of the BSI image sensor.

7 Claims, 7 Drawing Sheets

```
cutting the wafer package body via a first blade in a first cutting
process to separate the interconnect layer of adjacent BSI image
sensors;
```
↓
```
forming a first insulative layer on a outmost surface of the wafer
package body;
```
↓
```
cutting the wafer package body via a second blade in a second
cutting process to obtain independent BSI image sensors
```

FIG. 12 cutting the wafer package body by laser in a first cutting process to separate the interconnect layers of adjacent BSI image sensors, and simultaneously forming V-shaped slots;

↓ forming a first insulative layer on a outmost surface of the wafer package body and the first insulative layer covers inner sides of the V-shaped slots;

↓ cutting the wafer package body via a blade in a second cutting process to obtain independent BSI image sensors

WAFER-LEVEL PACKAGING METHOD OF BSI IMAGE SENSORS HAVING DIFFERENT CUTTING PROCESSES

BACKGROUND

1. Field of the Disclosure

The present disclosure relates to the field of semiconductor manufacturing, and more particularly to a wafer-level packaging method of BSI image sensors.

2. Description of Related Art

With continued progress of the chip manufacturing technology and the dedicated imaging technology, development of image sensor using Front Side Illumination (FSI) technology is promoted. As the human eye, when the light falls on the front of the chip of the FSI image sensor, the light will be finally converged to an optical-sensing region by reading circuits and interconnections. FSI technology is currently a mainstream image sensor technology, and has been confirmed by large production capacity, high reliability and high yield as well as an attractive price and other advantages. The FSI technology has been greatly promoted to be applied in mobile phones, laptop computers, digital vidicons and digital cameras and many other fields.

As the electronics industry trends towards compact size, the corresponding chip package also occurs a big change. Over the past thirty years, innovations of concentrating technology and semiconductor manufacturing technology had a significant impact to the pixel size of the image sensors. For example, the pixel size of the image sensor applied in the first portable vidicon is 2.5 microns, but now, the pixel size of the sensor applied in the mobile cameras is only 1.4 microns. Currently, the market demand for the pixel size is small to 1.1 microns, or even 0.65 microns.

Figure 1:
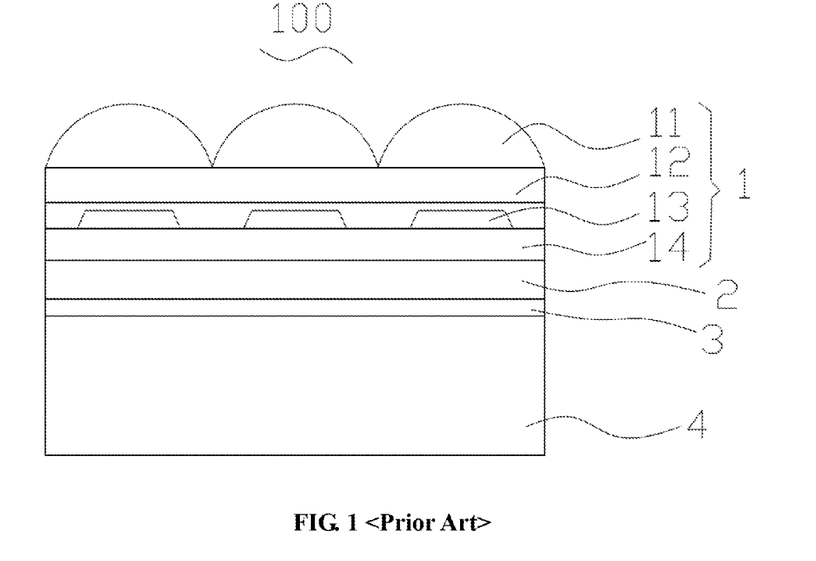
FIG. 1 is a schematic view of a center part portion of a conventional BSI image sensor.

Keeping the same wavelength of light while continually shrinking the pixel size, the FSI image sensors appear their physical limitations. In order to solve this problem, a BSI (backside illumination) technology is currently applied in the image sensors as shown in FIG. 1, which effectively removes the read circuit and interconnects on the optical path. Since the BSI image sensors have potential advantages of achieving higher quantum efficiency, the prospects thereof are very attractive.

Referring to FIG. 1, the BSI image sensor 100 includes an image sensing region 1, an interconnection layer 2, a thin silicon layer (not shown), a flat layer 3 and a substrate 4. The image sensing region 1 includes a microlens 11, a filter 12, an optical-sensing region 13 and a pixel region 14. The optical-sensing region 13 is adapted for converting an optical signal into an electrical signal. The optical-sensing region 13 includes a photodiode. The pixel region 14 is used to amplify the electrical signal converted by the photodiode and then output. In order to achieve higher pixel and effectiveness, the interconnection layer 2 of the BSI image sensor is made of a low dielectric constant material (low-k material) and a conductive metal, which can be used to output the electrical signals generated by the BSI image sensor.

However, because the low dielectric constant material is relatively brittle, when using the existing wafer-level packaging process to cut and obtain a plurality of independent BSI image sensors, it is easy to cause cracking of the interconnection layer 2 and let the external water vapor erode the BSI image sensor. Besides, due to special characteristics of the thin silicon layer, once its stress is not well released, reliability thereof might become poor. Furthermore, with the thin silicon layer exposed to the air, the reliability thereof will be greatly decreased. As a result, performance and reliability of the BSI image sensor are greatly influenced.

BRIEF SUMMARY

The present disclosure provides a wafer-level packaging method of BSI image sensors including the following steps:

S1: providing a wafer package body comprising a silicon base, an interconnect layer, a hollow wall and a substrate, an image sensing region and a plurality of pads;

S2: cutting the wafer package body by laser in a first cutting process to separate the interconnect layer of adjacent BSI image sensors;

S3: forming a first insulative layer on an outmost surface of the wafer package body; and S4: cutting the wafer package body via a blade in a second cutting process to obtain independent BSI image sensors.

Through laser cutting, it greatly reduces damage of the interconnect layer. As a result, the interconnect layer can be prevented from cracking and stress thereof can be well released.

The foregoing has outlined rather broadly the features and technical advantages of at least some sample embodiments of the present disclosure in order that the detailed description that follows may be better understood.

BRIEF DESCRIPTION OF THE DRAWINGS

The components in the drawing are not necessarily drawn to scale, the emphasis instead being placed upon clearly illustrating the principles of the described embodiments. In the drawings, reference numerals designate corresponding parts throughout various views, and all the views are schematic.

DETAILED DESCRIPTION

Reference will now be made to the drawing figures to describe the example embodiments in detail. In the following description, the same drawing reference numerals are used for the same elements in different drawings.

Referring to FIGS. 2 to 8, a wafer-level packaging method of a BSI (Backside Illumination) image sensor includes a first step for fabricating a wafer package body with certain structures, and a second step for cutting the wafer package body. Specifically, the first step includes the following steps:

S1) forming a wafer of the BSI image sensor;
S2) forming a wafer-level package substrate of the BSI image sensor;
S3) forming a wafer package body of the BSI image sensor;
S4) grinding the wafer package body and forming a plurality of openings via photolithography and plasma etching techniques;
S5) depositing a second insulative layer 40 on an upper surface of the wafer package body; and.
S6) fabricating circuits 50 on the second insulative layer 40 to ultimately achieve a wafer package body with certain structures ready for cutting.

Figure 2:
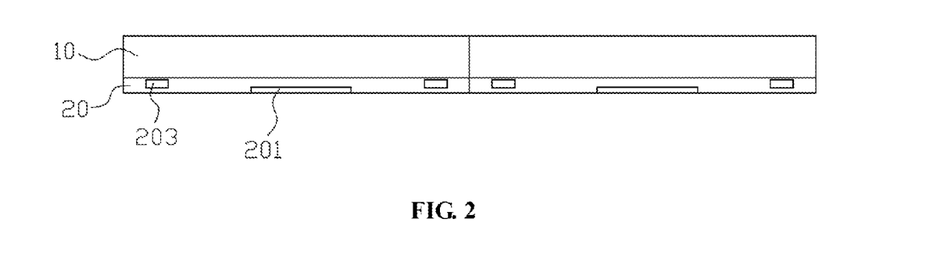
FIG. 2 is a schematic view of a wafer of a BSI image sensor in accordance with an illustrated embodiment.

Referring to FIG. 2, the step S1 further includes the following sub-steps:

providing a silicon base 10 which includes a first surface (i.e., a top surface) and a second surface (i.e., a bottom surface) opposite to the first surface;
fabricating an interconnect layer 20 on the first surface of the silicon base 10; and
fabricating a plurality of image sensing regions 201 on the interconnect layer 20 and a plurality of pads 203 corresponding to the image sensing regions 201.

Figure 3:
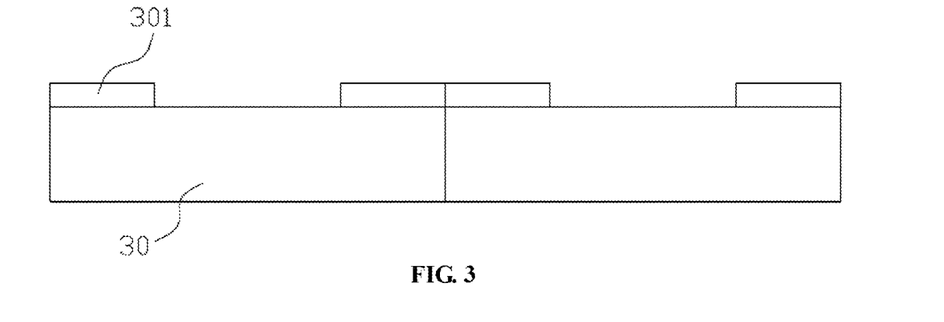
FIG. 3 is a schematic view of a wafer-level package substrate of the BSI image sensor.

Referring to FIG. 3, the step S2 further includes the following sub-steps:

providing a transparent substrate 30 which includes a first face (i.e., a top surface) and a second face (i.e., a bottom surface) opposite to the first face; and
forming a plurality of spaced hollow walls 301 etched from the second face towards the first face via a photolithography process.

Figure 4:
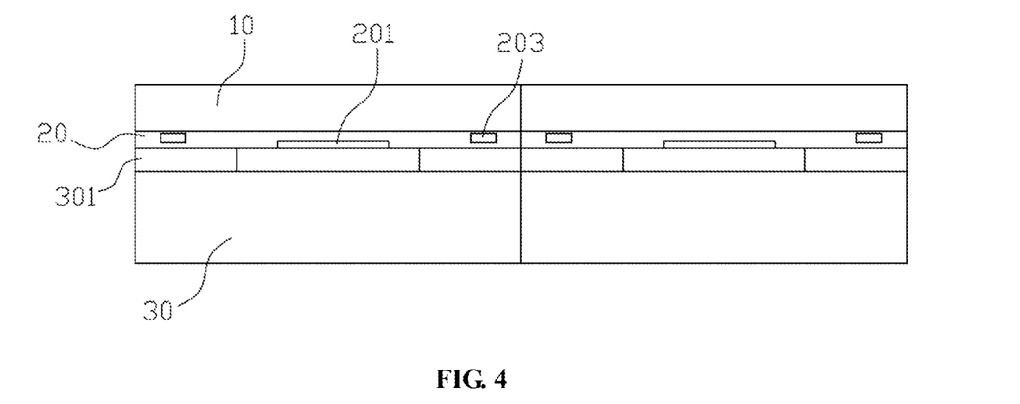
FIG. 4 is a schematic view of a wafer package body of the BSI image sensor with the wafer shown in FIG. 2 attached to the wafer-level package substrate shown in FIG. 3.

Referring to FIG. 4, the step S3 includes bonding the first surface of the silicon base 10 on which the interconnect layer 20 has been formed to the hollow walls 301 of the wafer-level package substrate so as to form the wafer package body. The wafer package body includes a plurality of BSI image sensors connected with each other.

Figure 5:
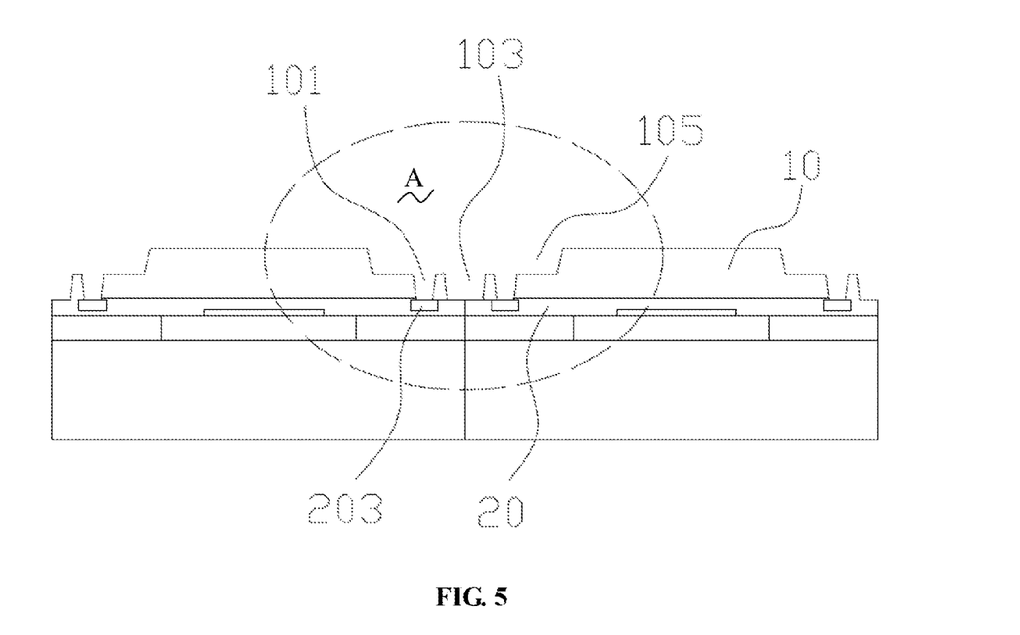
FIG. 5 is a schematic view of the wafer package body of the BSI image sensor as shown in FIG. 4, with an opening further formed thereon.
Figure 6:
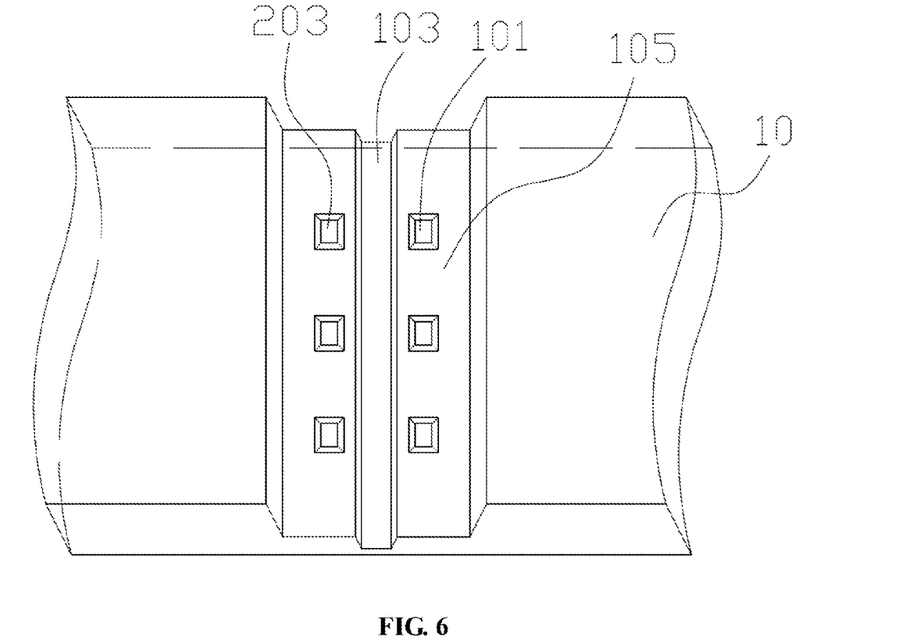
FIG. 6 is a top view of a portion A enclosed by a broken circle shown in FIG. 5.

Referring to FIGS. 5 and 6, in the step S4, after completion of the pressing process of the step S3, the second surface of the silicon base 10 is thinned by grinding technology. And then, the plurality of openings are formed on the second surface of the silicon base 10 via the photolithography and plasma etching techniques. According to the illustrated embodiment, the openings include a plurality of pad grooves 101 through which the pads 203 are exposed, a plurality of slots 103 through which the interconnect layer 20 is exposed, and a recess 105 with the pad grooves 101 and the slots 103 formed therein. It is understandable to those of ordinary skill in the art that the slots 103 are located between the adjacent BSI image sensors in order to divide the BSI image sensors. Usually, the slots 103 are located between the adjacent pads 203 of the adjacent BSI image sensors, which is easy to understand and thus detailed description thereabout is omitted herein.

Figure 7:
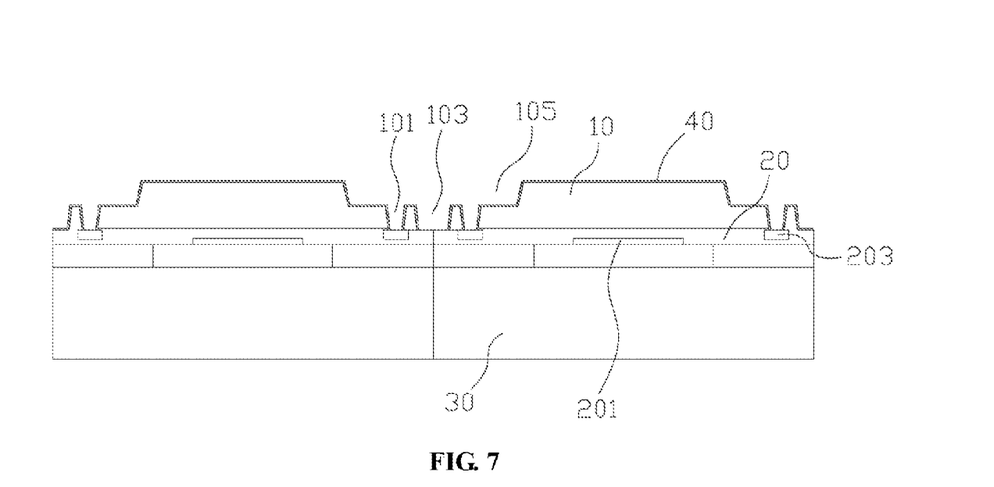
FIG. 7 is a schematic view of the wafer package body of the BSI image sensor as shown in FIG. 5, with a second insulative layer further formed thereon.

Referring to FIG. 7, in the step S5, the second insulative layer 40 is formed on the upper surface of the silicon base 10 via vapor deposition technique after the silicon base 10 has been treated by the photolithography and plasma etching techniques. The upper surface includes all the surfaces upwardly exposed on the silicon base 10. Specifically, as shown in FIG. 7, the second insulative layer 40 covers not only the second surface of the silicon base 10, but also inner side surfaces of the pad grooves 101, the slots 103 and the recess 105.

Figure 8:
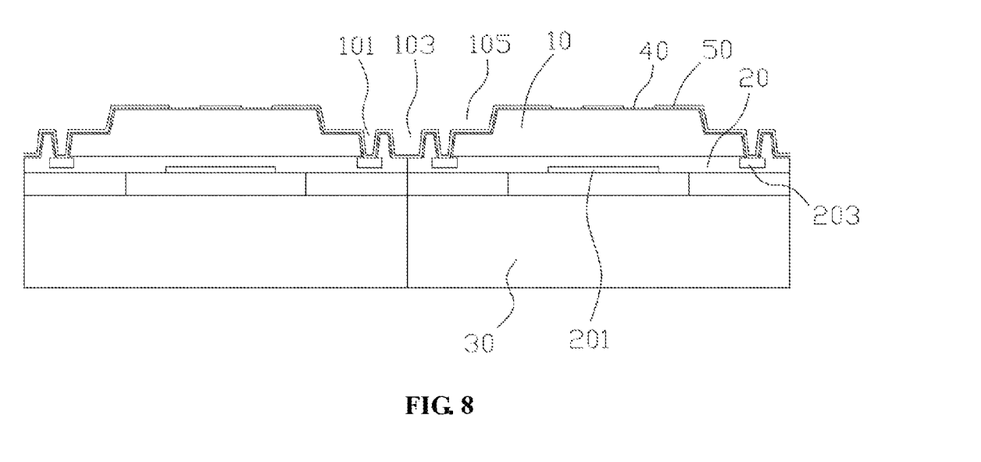
FIG. 8 is a schematic view of the wafer package body of the BSI image sensor as shown in FIG. 7, with circuits further formed thereon.

Referring to FIG. 8, in the step S6, the circuits 50 are fabricated on the second insulative layer 40 and the exposed pads 203 via photolithography and electroplating techniques. The circuits 50 are further formed on exposed surfaces of the interconnect layer 20.

After completion of the above process, the wafer package body of the BSI image sensor may be cut by a first way or a second way. The first way and the second way are respectively corresponding to a first embodiment and a second embodiment, which will be specifically described in detail in the following.

Figure 9:
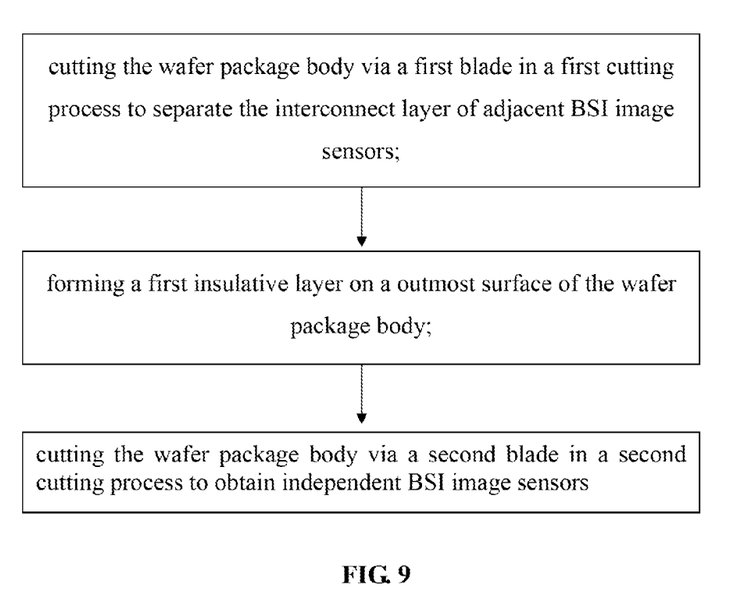
FIG. 9 is a wafer-level packaging method flowchart for fabricating the BSI image sensors according to a first embodiment.

Referring to FIG. 9, according to the first embodiment, the second step for cutting the wafer package body shown in FIG. 8 includes the following steps:

step 1: cutting the wafer package body through a first blade in a first cutting process;
step 2: forming a first insulative layer 60 on an upper surface of the wafer package body after the step 1; and
step 3: further cutting the wafer package body in a second cutting process so as to achieve independent BSI image sensors.

Figure 10:
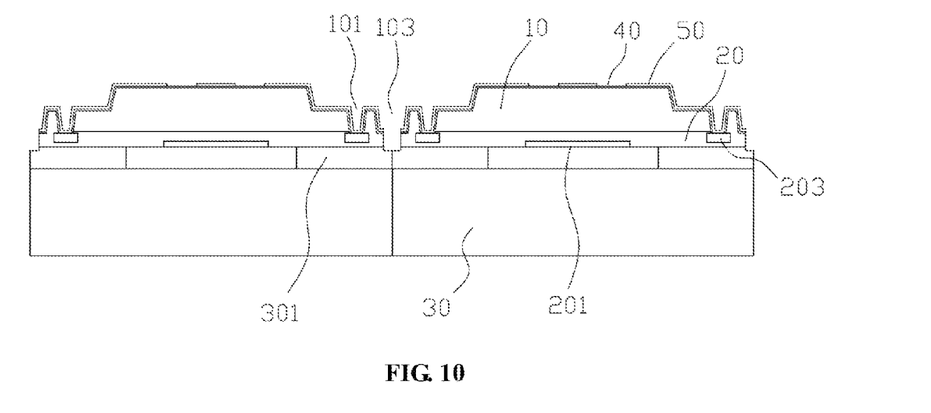
FIG. 10 is a schematic view of the wafer package body of the BSI image sensor after a first cutting process according to the first embodiment corresponding to FIG. 9.

Referring to FIG. 10, in the step 1, the wafer package body is partly cut a certain depth by the first blade in order to separate adjacent interconnect layers 20 of adjacent BSI image sensors. Specifically, the first blade is used to cut the wafer package body along a first cutting direction from the slots 103 towards the interconnect layer 20. The first cutting depth may be controlled to just reach part of the hollow walls 301 along the first cutting direction, which means that the hollow walls 301 are not cut to be separated after the first cutting process. Since materials of the interconnect layer 20 and a flat layer (not shown in FIG. 10) are relatively brittle and with poor ductility and toughness, the first blade is provided with greater hardness in order to reduce damage of the interconnect layer 20 and the flat layer. As a result, the interconnect layer 20 and the flat layer can be prevented from cracking, and stress thereof can be well released. The first blade may be a metal blade.

Figure 11:
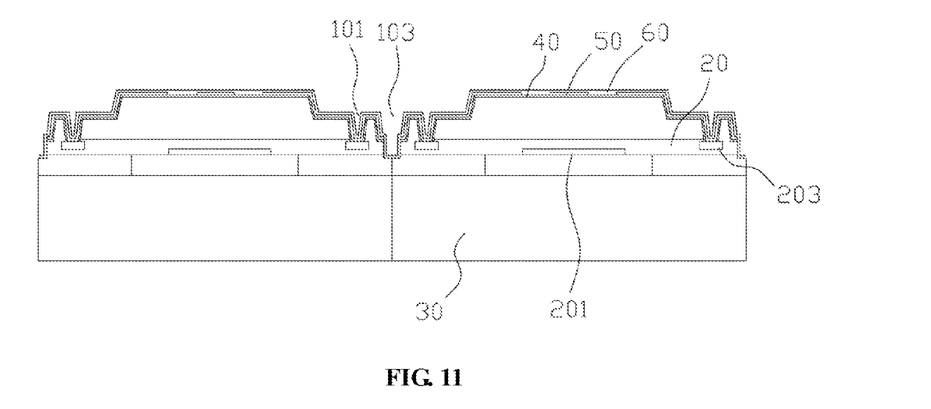
FIG. 11 is a schematic view of the wafer package body of the BSI image sensor as shown in FIG. 10, with a first insulative layer further formed thereon according to the first embodiment corresponding to FIG. 9.
Figure 12:
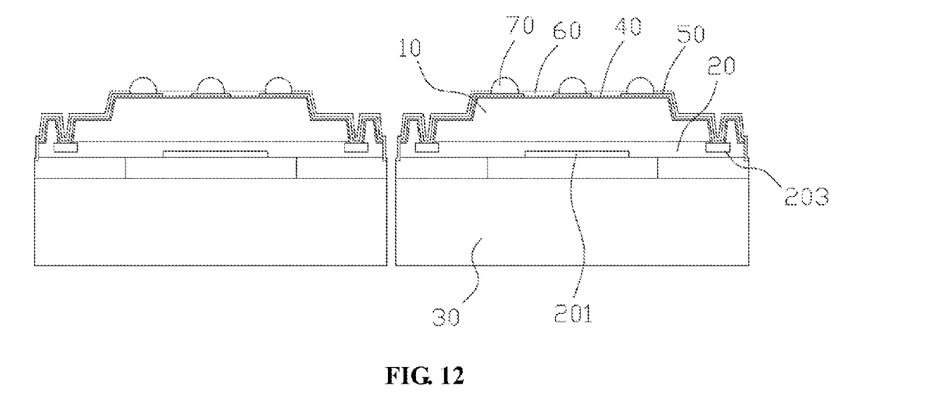
FIG. 12 is a schematic view of the wafer package body of the BSI image sensor after a second cutting process according to the first embodiment corresponding to FIG. 9.

Referring to FIGS. 11 and 12, in the step 2, the first insulative layer 60 is then fabricated on the upper surface of the wafer package body after the step 1. Besides, a plurality of soldering balls 70 are fabricated to electrically connect the circuits 50. Specifically, the first insulative layer 60 is formed on an exposed upper surface of the second insulative layer 40, as well as an upper surface of the circuits 50 and inner surfaces of the slots 103 after the first cutting process.

Referring to FIG. 8, the wafer package body of the step 2 is further cut by a second blade along a second cutting direction from the slots 103 through the transparent substrate 30 so as to achieve independent BSI image sensors. The second cutting direction is in alignment with the first cutting direction along a vertical direction. Material of the second blade is softer than that of the first blade. A resin blade which is suitable for cutting the transparent substrate 30 may be selected as the second blade. If the first blade with hard material is used to cut the transparent substrate 30, the transparent substrate 30 will easily be damaged. However, such damage can be avoided by using the second blade with a relative soft material, and edge crack of the transparent substrate 30 during cutting may be avoided as well in the second cutting process.

According to the first embodiment, the first blade is wider than the second blade so that a cutting side of the BSI image sensor is of a step-shaped configuration. Besides, the exposed interconnect layer 20 and the flat layer are then covered by the first insulative layer 60 which is formed after the step 1 so that the interconnect layer 20 and the flat layer can be prevented from directly in contact with the air. Performance and reliability of the BSI image sensor are effectively improved.

As a result, utilizing the wafer-level packaging method of the BSI image sensor according to the first embodiment, damage of the interconnect layer 20, the flat layer and the transparent substrate 30 is decreased, crack of the interconnect layer 20, the flat layer and the transparent substrate 30 may be avoided, and erosion problems of the BSI image sensor caused by external water vapor may be decreased as well. As a result, performance and reliability of the BSI image sensor are greatly improved.

Figure 13:
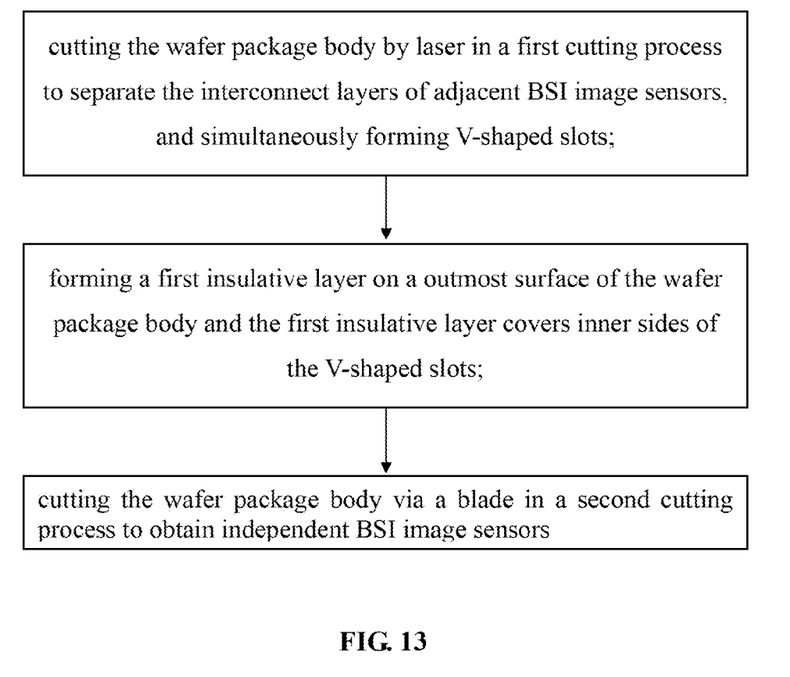
FIG. 13 is another wafer-level packaging method flowchart for fabricating the BSI image sensors according to a second embodiment.

Referring to FIG. 13, according to the second embodiment, another wafer-level packaging method of the BSI image sensor includes the following steps:

step 1: cutting the wafer package body by laser in a first cutting process;

step 2: forming a first insulative layer 60 on an upper surface of the wafer package body after the step 1; and step 3: further cutting the wafer package body with a blade in a second cutting process so as to achieve independent BSI image sensors.

Figure 14:
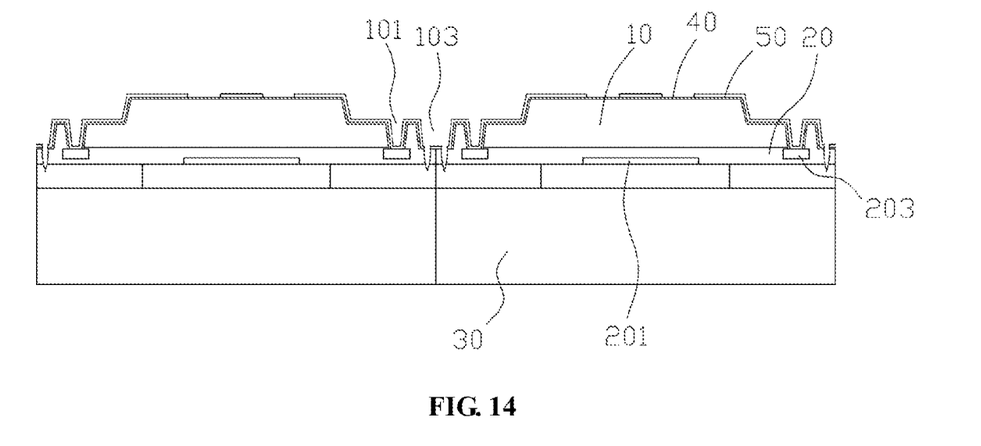
FIG. 14 is a schematic view of the wafer package body of the BSI image sensor after a first cutting process according to the second embodiment corresponding to FIG. 13.
Figure 15:
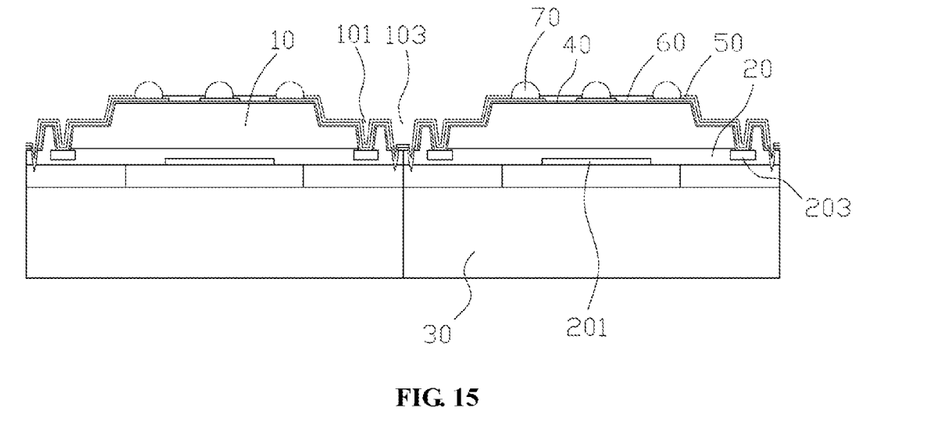
FIG. 15 is a schematic view of the wafer package body of the BSI image sensor as shown in FIG. 14, with a first insulative layer further formed thereon according to the second embodiment corresponding to FIG. 13.

Referring to FIG. 14, in the step 1, the wafer package body is partly cut a certain depth by laser in order to separate adjacent interconnect layers 20 of adjacent BSI image sensors. The first cutting process may be a scribing cutting which means that the laser is used to cut the wafer package body along a first cutting direction from lateral sides of the slots 103 towards the interconnect layer 20. The scribing cutting depth is controlled to just reach part of the hollow walls 301 along the first cutting direction, which means that the hollow walls 301 are not cut to be separated in the first cutting process. Since materials of the interconnect layer 20 and a flat layer are relatively brittle and with poor ductility and toughness, the laser cutting reduces damage of the interconnect layer 20 and the flat layer. As a result, the interconnect layer 20 and the flat layer may be prevented from cracking. Besides, stress thereof may be well released.

Referring to FIG. 12, in the step 2, the first insulative layer 60 is then fabricated on the upper surface of the wafer package body after the step 1. Besides, a plurality of soldering balls 70 are fabricated to electrically connect the circuits 50. Specifically, the first insulative layer 60 is formed on an exposed upper surface of the second insulative layer 40, an upper surface of the circuits 50 and inner surfaces of V-shaped slots formed by the laser scribing.

Figure 16:
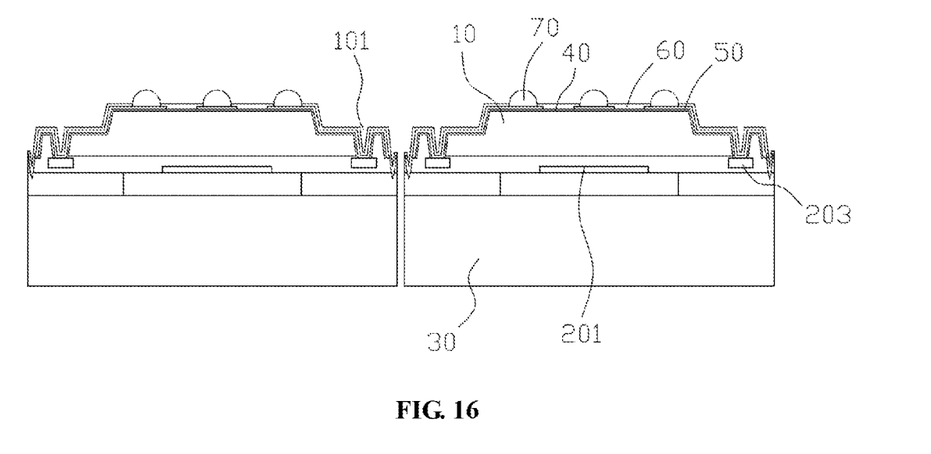
FIG. 16 is a schematic view of the wafer package body of the BSI image sensor after a second cutting process according to the second embodiment corresponding to FIG. 13.

Referring to FIG. 16, the wafer package body of the step 2 is further cut off by a blade from a position between two scribe traces formed by the prior laser scribing so as to achieve independent BSI image sensors. Specifically, in the second cutting process, the blade cuts from the slots 103, and then passes the interconnect layer 20, the flat layer, the second insulative layer 40 and the transparent substrate 30 to separate the BSI image sensors. A resin blade which is suitable for cutting the transparent substrate 30 may be selected as the blade. If a metallic blade with hard material is used to cut the transparent substrate 30, the transparent substrate 30 may easily be damaged, even getting cracked. Although the interconnect layer 20 and the flat layer maybe get cracked by using the blade during the second cutting process, since the interconnect layers 20 of the adjacent BSI image sensors have been separated by the laser cutting, even if such crack happens, it may not influence the performance and reliability of the BSI image sensor at all.

According to the second embodiment, the V-shaped slots are formed from the lateral sides of the slots 103 by the laser cutting. However, the interconnect layer 20 and the flat layer exposed on such V-shaped slots are covered by the first insulative layer 60 so that the interconnect layer 20 and the flat layer may be prevented from directly in contact with the air. Performance and reliability of the BSI image sensor are effectively improved.

As a result, utilizing the wafer-level packaging method of the BSI image sensor according to the second embodiment, damage of the interconnect layer 20, the flat layer and the transparent substrate 30 is decreased, crack of the interconnect layer 20, the flat layer and the transparent substrate 30 may be avoided, and erosion problems of the BSI image sensor caused by external water vapor may be decreased as well. As a result, performance and reliability of the BSI image sensor are greatly improved.

It is to be understood, however, that even though numerous characteristics and advantages of exemplary embodiments have been set out in the foregoing description, together with details of the structures and functions of the embodiments, the disclosure is illustrative only and that changes may be made in detail within the principles of present disclosure to the full extent indicated by the broadest general meaning of the terms in which the appended claims are expressed.

What is claimed is:

1. A wafer-level packaging method of BSI image sensors comprising the following steps:

S1: providing a wafer package body comprising a silicon base, an interconnect layer, a hollow wall and a transparent substrate, an image sensing region and a plurality of pads, the silicon base comprising a first surface and a second surface opposite to the first surface, the interconnect layer being formed on the first surface of the silicon base, the image sensing region being fabricated on the interconnect layer, the transparent substrate comprising another first surface and another second surface opposite to the another first surface, the hollow wall being formed on the another first surface, the wafer package body being formed by bonding the first surface of the silicon base on which the interconnect layer has been formed to the hollow wall of the transparent substrate of which the silicon base, the interconnect layer, the hollow wall and the transparent substrate are piled one above another in turn along a thickness direction;

S2: cutting the wafer package body along the thickness direction by laser in a first cutting process, the wafer package body being partly cut a certain depth by the laser in order to separate the interconnect layer of adjacent BSI image sensors, with the transparent substrate not being incised by the laser;

S3: forming a first insulative layer on an outmost surface of the wafer package body; and S4: cutting the wafer package body via a blade in a second cutting process, the transparent substrate being cut off by the blade in order to obtain independent BSI image sensors.

2. The wafer-level packaging method as claimed in claim 1, wherein the blade is a resin blade.

3. The wafer-level packaging method as claimed in claim 1, wherein in the step S2, a plurality of V-shaped slots are simultaneously formed by the laser in the first cutting process.

4. The wafer-level packaging method as claimed in claim 3, wherein in the step S3, inner sides of the V-shaped slots are covered by the first insulative layer.

5. The wafer-level packaging method as claimed in claim 1, further comprising following steps before the step S2:

forming a plurality of pad grooves on the silicon base to expose the pads and a plurality of slots to expose the interconnect layer, and forming a second insulative layer on a surface of the silicon base.

6. The wafer-level packaging method as claimed in claim 5, wherein in the step S4, the blade cuts from a position between two scribe traces formed in the first cutting process to separate the BSI image sensors.

7. The wafer-level packaging method as claimed in claim 1, wherein in the step S2, the certain depth is controlled to just incise part of the hollow wall rather than to cut off the interconnect layer.

* * * * *